United States Patent [19]

Langheinrich

[11] 3,805,041

[45] Apr. 16, 1974

[54] CIRCUIT FOR CONVERTING ONE CODE INTO ANOTHER CODE

[75] Inventor: Hans Langheinrich, Offenbach/Main, Germany

[73] Assignee: VDO Tachometer Werke Adolf Schindling GmbH, Frankfurt, Germany

[22] Filed: Oct. 27, 1971

[21] Appl. No.: 192,830

[30] Foreign Application Priority Data

Dec. 15, 1970 Germany............................ 2061609

[52] U.S. Cl........................... 235/155, 340/347 DD

[51] Int. Cl............................................ H03k 13/24

[58] Field of Search...... 340/347 DD; 235/154, 155, 235/92

[56] References Cited

UNITED STATES PATENTS

| | | | |
|---|---|---|---|
| 2,864,557 | 12/1958 | Hobbs | 235/155 |
| 3,064,889 | 11/1962 | Hupp | 235/92 |
| 3,276,013 | 9/1966 | Chandler | 340/347 DD |
| 3,560,959 | 2/1971 | Bergey | 340/347 DD |

*Primary Examiner*—Charles D. Miller
*Attorney, Agent, or Firm*—Otto John Munz

[57] ABSTRACT

A code converter having a first counter operating in a first code and a second counter operating in a second code, for use in converting data from the first code to the second code. Coincidence between the bits in the first counter and those in the second indicates correct conversion.

2 Claims, 3 Drawing Figures

PATENTED APR 16 1974 3,805,041

SHEET 1 OF 3

CIRCUIT FOR CONVERTING ONE CODE INTO ANOTHER CODE

BACKGROUND OF THE INVENTION

1. Field of the Invention

The invention relates to a circuit for converting one code, especially a Gillham code, into another code, especially a BCD (binary coded decimal) code.

2. Description of the Prior Art

Test data and other data, in order to be transmitted or processed, are for known reasons frequently converted into a coded form, the coding being carried out, depending on the circumstances, by means of mechanical or electrical coding devices which require the use of specific coding for faultless coding. On account of the coding devices employed, codes sometimes have to be used which are too complex for easy processing and which must therefore be converted before the data involved can be processed. Thus, in order to transmit for instance the values indicated by a barometric altimeter from an airplane to a ground control station, a mechanical coding apparatus with an angle-coding disc is used. The disc is provided with several tracks capable of being scanned by mechanical or optical means and representing a Gillham code. This code, like the Gray code and other non-decimal codes, has the advantage that, when the coding disc rotates, the signal varies in each instance only on a single track, thereby excluding coding mistakes as they occur in a BCD code and other decimal codes where the signal can vary simultaneously on two tracks. Since such a non-decimal code renders processing of the data considerably more difficult, it is converted, before the data is processed, into a BCD code, in which data can be more easily processed, or into another decimal code.

It is already known to convert one code into another code by means of gates. This requires generally, and especially in the conversion of a Gillham code into a BCD code, expensive apparatus which, in addition, increases in expense with a growing number of bits to be transmitted or processed. Such conversion devices provided with gates require considerable space and are quite expensive so that they are unsuitable for many purposes.

SUMMARY OF THE INVENTION

These difficulties and disadvantages are overcome by the invention, which provides two counters fed by a pulse generator, the first of which presents the counted pulses in the code to be converted and the second in the other code. It also provides a coincidence circuit which compares the bits of the first counter with those of the data to be converted and which, when all bits fed to this coincidence circuit agree, stops, via a control switch, the counting run of both counters and initiates a fresh counting procedure. If suitable counters are employed, such a circuit permits not only the conversion of any code whatever into any other code, but also has the advantage that it can be adapted, within a wide range, to the conversion problems encountered, merely by an exchange of one or both counters.

The control circuit preferably comprises a gate circuit whose inputs are respectively connected to the pulse generator and to the coincidence circuit and whose output is connected to the counter inputs and two monostable multivibrators, the first of which is triggered by the coincidence circuit and has its output connected to a store which in turn is connected to the output of the second counter. The second multivibrator is triggered directly by the first multivibrator, and its complementary output is connected to the reset (erase) inputs of the two counters. Such a a control circuit has proved advantageous in a circuit for continual conversion of a code as is necessary for continually variable data. When, on the other hand, the coding of data which varies only at relatively long time intervals is to be converted, it is feasible to dispense with the two monostable multivibrators and possibly also with the store connected to the output of the second counter, since, in this case, the reset of the counters and the storing of the result of the second counter, if necessary at all, can be carried out manually.

For the comparison of the bits of the first counter with those of the data to be converted, the usual commercially available coincidence circuits can be used. However, these circuits contain, besides the function "Is $Z1 = Z2$?", also the functions "Is $Z1 > Z2$?" and "Is $Z1 < Z2$?" These additional functions are, in most cases, e.g., for the conversion of a Gillham or Gray code, not needed at all. Since these un-needed coincidence circuits are expensive, it is advisable to use a coincidence circuit wherein for each two bits to be compared, a first and a second AND-NOT gate, each with two inputs, are provided. One input of each gate is triggered directly by a respective one of the two bits, and the other two inputs indirectly via a third AND-NOT gate, which has both of the bits as inputs. The outputs of all first and second AND-NOT gates are combined into one common wired-AND function, a so-called WIRED-AND. The AND-NOT gate also is definable as the NAND gate.

BRIEF DESCRIPTION OF THE DRAWINGS

The invention will be explained in greater detail in connection with the drawing, which illustrates an embodiment by way of example only.

DESCRIPTION OF THE PREFERRED EMBODIMENT

Figure 1:
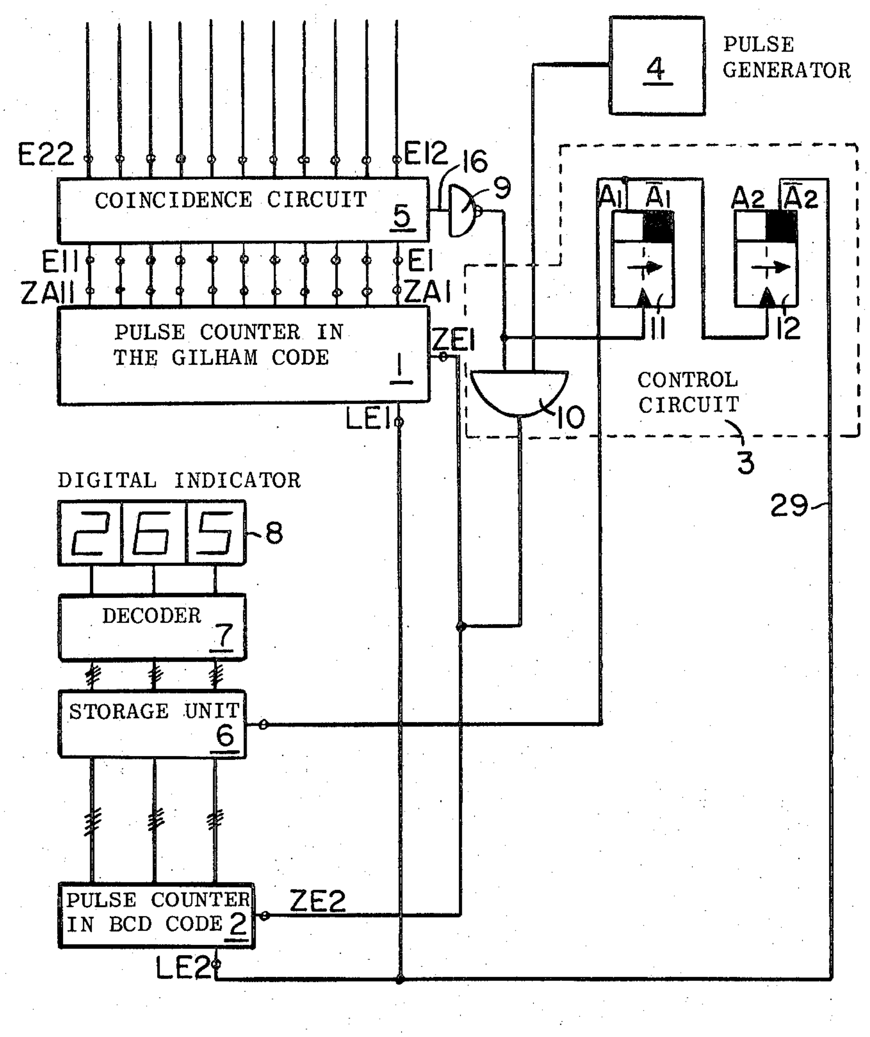
FIG. 1 is a block circuit diagram of the complete system.

A circuit is provided for converting 11-bit data transmitted by an altimeter and available in a Gillham code, into corresponding BCD data. This circuit contains two counters 1 and 2 whose inputs are connected in parallel and to which pulses are fed, from a pulse generator 4 via a control circuit 3. The first counter 1, which presents the counted pulses in the Gillham code, is connected, with its outputs ZA1 to ZA11 to the inputs E1 to E11 of a coincidence circuit 5. The 11-bit data of the altimeter, as produced by a coding disc, is fed to the other eleven inputs E12 to E22 of the coincidence or comparing circuit 5. The outputs of the second counter 2, which presents the counted pulses in the BCD code, are connected to the inputs of a store or storage unit 6, to whose output a decoding device 7 and a digital indicating system 8 are connected, thereby to indicate the flying altitude.

Control circuit 3, which is triggered by coincidence circuit 5 via an inverter 9, comprises, as a gate circuit, an AND gate 10, whose output is connected to the inputs ZE1 and ZE2 of the two counters 1 and 2, and to whose inputs are connected the coincidence circuit 5 via the inverter 9, and the pulse generator 4. Furthermore, there are two series-connected monostable multivibrators 11 and 12. Multivibrator 11 is triggered via inverter 9 by coincidence circuit 5 and produces a storing pulse for store 6. Multivibrator 12 provides its complementary output $\bar{A}_2$ to the reset pulse inputs LE1 and LE2 of the two counters 1 and 2.

Figure 2:
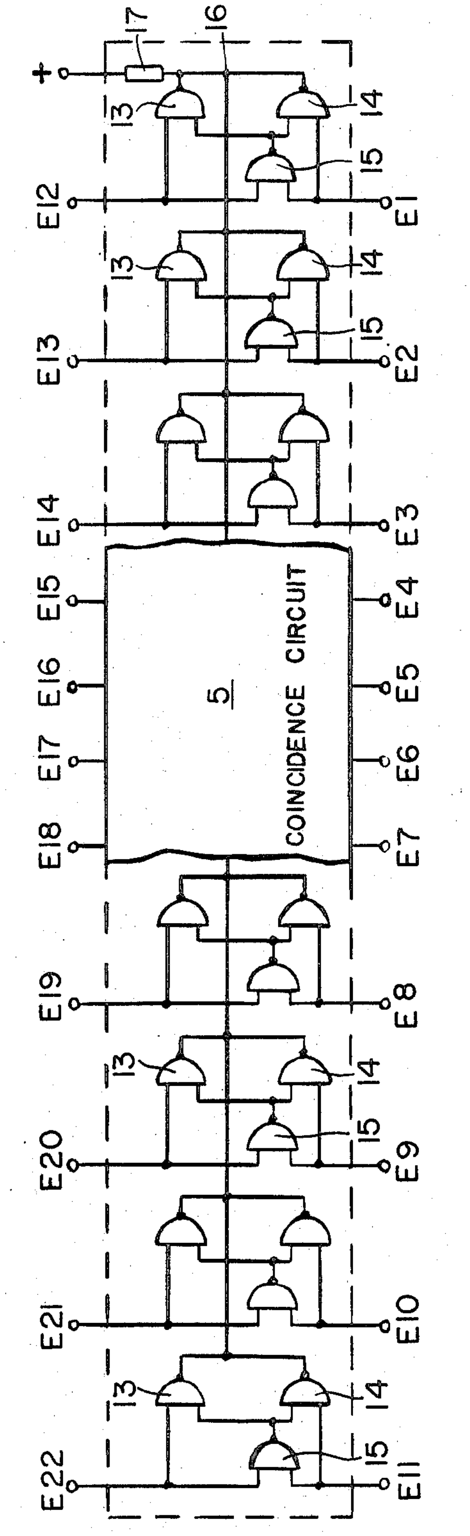
FIG. 2 is a block circuit diagram of the structure of a coincidence circuit for use in the invention.

As shown in FIG. 2, coincidence circuit 5 consists of eleven structural groups, each for a single pair of the eleven bit pairs to be compared. Each group contains three AND-NOT gates 13, 14 and 15. Each one of the pair of bits to be compared is fed directly to one of the two inputs of a respective one of the two AND-NOT gates 13 and 14, while the other of the two inputs of both AND-NOT gates 13 and 14 is connected to the output of the third AND-NOT gate 15, whose two inputs are likewise respectively directly triggered by the two bits to be compared. The outputs of all AND-NOT gates 13 and 14 are combined into a common WIRED-AND, wherefrom an output line 16 departs. The collectors of the individual transistors contained in AND-NOT gates 13 and 14 are biased positively via a single collector resistor 17 which is common to AND-NOT gates 13 and 14 connected to the WIRED-AND.

Figure 3:
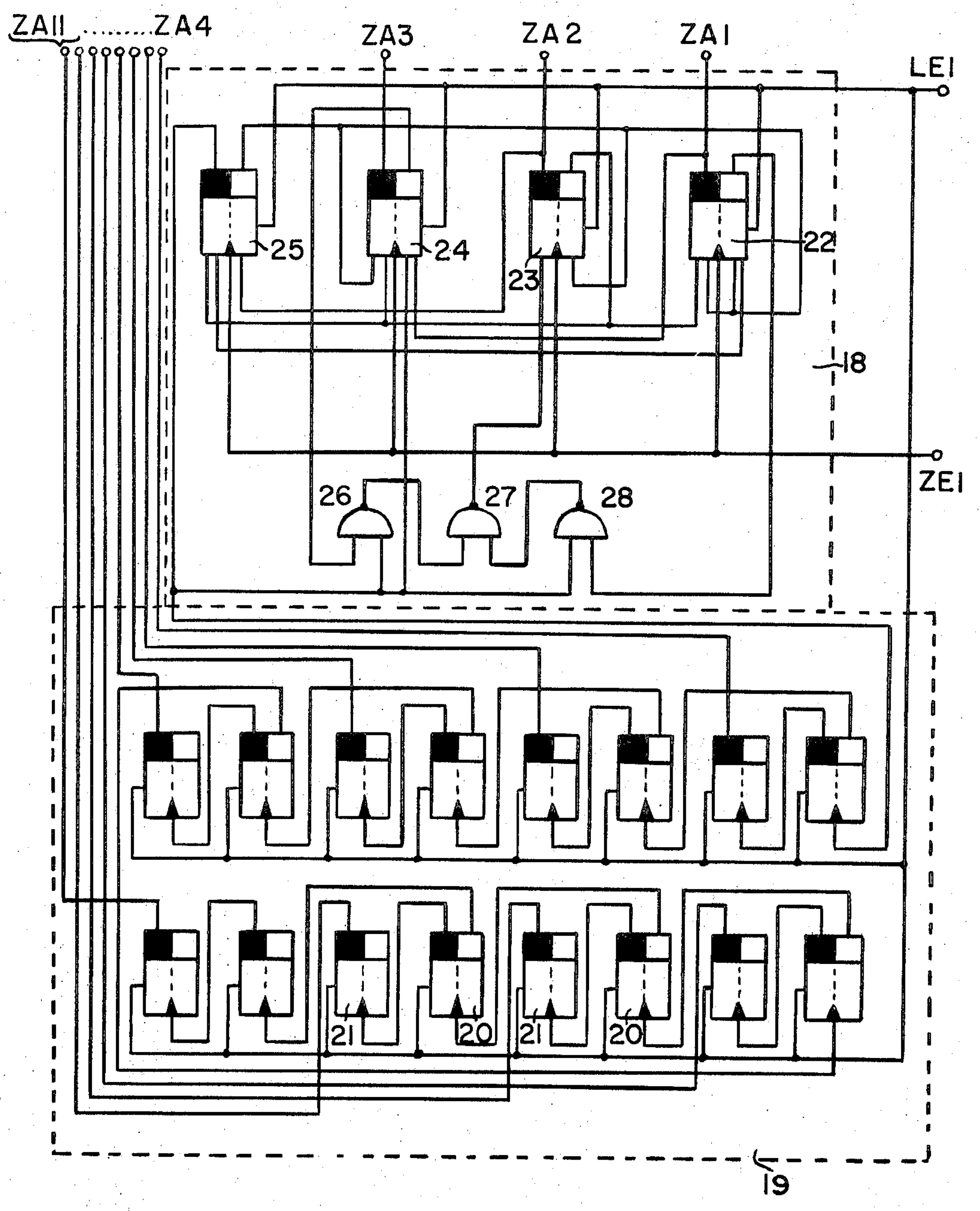
FIG. 3 is a block circuit diagram of a counter which presents the counted pulses in the code to be converted.

Counter 1, which presents the counted pulses in the Gillham code, comprises, as shown in FIG. 3, preferably a synchronous counter 18 which processes the first three bits characterizing the data, and a counting chain 19 connected to the output of counter 18, which chain contains for each of the subsequent bits, i.e., the remaining eight bits, two series-connected bistable multivibrators 20 and 21. Synchronous counter 18 comprises essentially three bistable multivibrators 22, 23 and 24 with outputs ZA1, ZA2 and ZA3, to which the first three bits are fed. Since the synchronous counter 18 must apply an output pulse to counting chain 19 immediately at the moment when it does not continue switching, counter 18 also contains a further bistable multivibrator stage 25 which switches at a moment when synchronous counter 18 is to transmit a pulse, but stage 25 itself remains in an unchanged state at the arrival of an input pulse. The connection of the inputs and outputs of multivibrator 22, 23, 24 and 25 and of the AND-NOT gates 26, 27 and 28 can be calculated in a known manner with the rules of Boolean algebra and known tables of formal logic as provided in the known multivibrator data sheets.

In operation, the bits fed from the coding disc and those transmitted by counter 1 do not coincide. Then a ZERO signal appears on the output line 16 of the coincidence circuit 5, and a ONE signal appears at the input of AND gate 10 because of inverter 10. The result thereof is that the pulses produced by pulse generator 4 can pass through AND gate 10 to inputs ZE1 and ZE2 of counters 1 and 2, which may be in their normal state. Counters 1 and 2, which are fed from pulse generator 4, run then at high speed, in which operation the bits fed from counter 1 can be continually compared with the bits transmitted from the coding disc.

As soon as all bits at the inputs E1 to E12, E2 to E13, . . . E11 to E22 of coincidence circuit 5 agree, a ONE signal appears at output line 16 and therefore a ZERO signal appears from the inverter 9, whereby AND gate 10 is blocked and the pulse supply to counters 1 and 2 is stopped. Since pulses were fed to both counters 1 and 2 in parallel, an equal quantity of pulses have entered the two counters 1 and 2, and therefore the two counter states correspond to each other. The code conversion is therewith concluded.

The ZERO signal transmitted by inverter 9 at coincidence has the effect that monostable mutivibrator stage 11 switches for a short period of time into its unstable state and therefore supplies a square-wave pulse by which store 6 picks up the counting result from counter 2. At the same time monostable multivibrator stage 12 is activated by the trailing edge of this square-wave pulse. The ZERO signal appearing thereby at the complementary output $\bar{A}_2$ is fed via line 29 to counters 1 and 2. The latter counters are reset and a fresh counting procedure can start, since after the reset of counter 1, a coincidence between the outputs of counter 1 and the signals arriving from the coding disc no longer exists, and therefore AND gate 10 becomes free again.

We claim:

1. A circuit for converting numerical data in a code of a first type into corresponding numerical data in a code of a second type, comprising A. a pulse generator for providing a train of pulses, B. first counter means connected to receive and count said pulses and to provide first counter output signals corresponding, in said code of a first type, to the number of pulses thus counted, C. second counter means connected to receive and count said pulses and to provide second counter output signals corresponding, in said code of a second type, to the number of said pulses thus counted, D. means for comparing said numerical data in a code of a first type with said first counter output signals in said code of a first type and, responsive to agreement in value between the numerical data and the first counter output signals, causing the second counter output to be taken as said corresponding numerical data in said code of a second type, and E. a control circuit means responsive to said comparing means operating upon said agreement, causing both first and second counter means to stop counting said pulses, to reset to zero, and to begin a new counting procedure, wherein said control circuit means comprises:

F. a gate means (10) responsive to said pulse generator and to said comparing means for providing said train of pulses to both said first and said second counter means, G. first monostable multivibrator (11) triggered by said comparing means for providing a first multivibrator output, H. second monostable multivibrator (12) triggered by said first multivibrator output for providing a second multivibrator output, and further comprising, I. a storage unit (6) for temporarily holding said second counter output signals, the storage unit being triggered to hold the present value of the second counter output signals by said first multivibrator output, said second multivibrator output being connected to reset both said first and said second counting means to zero.

2. A circuit for converting numerical data in a code of a first type into corresponding numerical data in a code of a second type, comprising A. a pulse generator for providing a train of pulses, B. first counter means connected to receive and count said pulses and to provide first counter output signals corresponding, in said code of a first type, to the number of pulses thus counted, C. second counter means connected to receive and count said pulses and to provide second counter output signals corresponding, in said code of a second type, to the number of said pulses thus counted, and D. means for comparing said numerical data in a code of a first type with said first counter output signals in said code of a first type and, responsive to agreement in value between the numerical data and the first counter output signals, causing the second counter output to be taken as said corresponding numerical data in said code of a second type, wherein said comparing means (5) comprises for each two bits to be compared, a first and a second AND-NOT gate (13, 14) each with two inputs, of which one of the inputs of each gate is triggered directly by one of the two bits and each of the other inputs are triggered by the output of a third AND-NOT gate (15) having said two bits as its input, the outputs of all first and second AND-NOT gates being combined into a WIRED-AND function.

* * * * *